US008288701B2

(12) United States Patent
Chen et al.

(10) Patent No.: US 8,288,701 B2
(45) Date of Patent: Oct. 16, 2012

(54) METHOD AND SYSTEM FOR CONTROLLING POWER TO PIXELS IN AN IMAGER

(75) Inventors: Yandong Chen, Pasadena, CA (US); Yaowu Mo, Arcadia, CA (US)

(73) Assignee: Aptina Imaging Corporation, George Town (KY)

( * ) Notice: Subject to any disclaimer, the term of this patent is extended or adjusted under 35 U.S.C. 154(b) by 897 days.

(21) Appl. No.: 12/396,546

(22) Filed: Mar. 3, 2009

(65) Prior Publication Data

US 2010/0225243 A1 Sep. 9, 2010

(51) Int. Cl.
*H01L 27/00* (2006.01)
*H01L 31/00* (2006.01)
*H04N 5/335* (2011.01)

(52) U.S. Cl. ..................... 250/208.1; 257/229; 257/292; 348/308

(58) Field of Classification Search ............... 250/208.1, 250/214.1; 257/222, 225, 229, 231, 443, 257/290, 291, 292; 348/308, E3.021
See application file for complete search history.

(56) References Cited

U.S. PATENT DOCUMENTS

| | | | | |
|---|---|---|---|---|
| 4,811,371 | A * | 3/1989 | Tower | 377/60 |
| 6,353,324 | B1 * | 3/2002 | Uber et al. | 324/457 |
| 7,015,448 | B2 | 3/2006 | Barna | |
| 7,071,505 | B2 | 7/2006 | Rhodes | |
| 7,378,635 | B2 | 5/2008 | Agranov et al. | |
| 7,872,682 | B2 * | 1/2011 | Rysinski et al. | 348/297 |
| 8,093,541 | B2 * | 1/2012 | Chen | 250/208.1 |
| 2002/0113887 | A1 * | 8/2002 | Iimura et al. | 348/310 |
| 2006/0256220 | A1 * | 11/2006 | Rysinski et al. | 348/308 |
| 2007/0145239 | A1 | 6/2007 | Mheen et al. | |
| 2007/0221823 | A1 * | 9/2007 | Xu et al. | 250/208.1 |
| 2007/0272828 | A1 | 11/2007 | Xu | |
| 2009/0236644 | A1 * | 9/2009 | Adkisson et al. | 257/292 |
| 2009/0302359 | A1 * | 12/2009 | Chen | 257/292 |
| 2010/0225243 | A1 * | 9/2010 | Chen et al. | 315/291 |
| 2010/0321551 | A1 * | 12/2010 | Rysinski et al. | 348/308 |

* cited by examiner

*Primary Examiner* — John Lee

(57) ABSTRACT

A system for controlling power applied to pixels in an imager. A first switch coupling the internal power node of the pixels to the power supply of the imager. A second switch coupling the internal power node of the pixels to a ground potential or low potential. The first and second switches are controlled complimentary to each other during integration and readout of the pixels. A third switch providing a high impedance mode where the internal power node and n+ guard ring are isolated from the operating and ground potentials.

16 Claims, 7 Drawing Sheets

| | DYNAMIC | STATIC | STATIC | DYNAMIC | | | |
|---|---|---|---|---|---|---|---|
| | power_down | vaapix_hiZ_standby_b | vaapix_always_hi | vaapix_switch_down | vaapix_ring_switch_bar | vaapix_switch | |
| 1 | 0 | X | 0 | 0 | 0 | 0 | switch_up |
| 2 | 0 | X | 0 | 1 | 0 | 1 | switch_down |
| 3 | 0 | X | 1 | X | 0 | 0 | switch_up |
| 4 | 1 | 0 | X | X | 1 | 0 | HiZ |
| 5 | 1 | 1 | X | X | 0 | 0 | switch_up |

FIG. 4

METHOD AND SYSTEM FOR CONTROLLING POWER TO PIXELS IN AN IMAGER

FIELD OF THE INVENTION

In general, the present invention relates to image devices, and more specifically to methods and systems for controlling the power supplied to the pixels of an image device.

BACKGROUND OF THE INVENTION

In a digital imager, pixel power is required to perform operations, such as resetting a floating diffusion and translating charge on the floating diffusion to an output pixel voltage. The pixel power, however, may induce unwanted behavior within the digital imager. Specifically, the digital imager may suffer from effects of hot pixels and dark current.

Hot pixels are generally caused by pixels with higher than normal rates of charge leakage. Hot pixels show up as bright points in an image. Dark currents, on the other hand, are charges accumulated by a pixel even though the pixel is not exposed to light. Thus, dark currents may be seen as off-set noise.

Two contributing causes of hot pixels and dark currents are high floating diffusion voltages and fringing field effects in a drain terminal of a reset transistor. A high floating diffusion voltage is maintained by global anti-blooming functions, since the reset signal is high for unselected rows. A fringing field effect of the drain terminal in the reset transistor is caused by a voltage potential being supplied to the power node of a pixel. The voltage potential on the power node lowers the p-n potential barrier, thus causing charge leakage.

Another unwanted result caused by voltage being supplied to the power node is standby leakage current. Specifically, standby leakage current is dominated by the p-n junction leakage current between the N-epitaxial layer and the P-substrate underneath it, as well as the buried P-layer above it. In addition, leakage current is present between the N+ diffusion areas within the pixel array and the P-epitaxial layer. Such leakage current is particularly undesirable in low-power applications, such as portable devices utilizing image sensors.

It would be an advantage to have a system and method for switching the pixel power. It would also be advantageous if the system and method could provide a high impedance mode.

BRIEF DESCRIPTION OF THE DRAWINGS

FIG. 4 is a truth table for the behavior of drivers shown in FIG. 3, in accordance with an embodiment of the present invention.

DETAILED DESCRIPTION OF THE INVENTION

In one embodiment, the present invention includes a switch for coupling a power supply to a power node of a pixel. In general, the switch controls the pixel power by applying an operating potential to the power node, applying a ground potential to the power node or applying a low potential to the power node. The switch also controls the pixel power by isolating the power node in a high impedance state.

Figure 1:
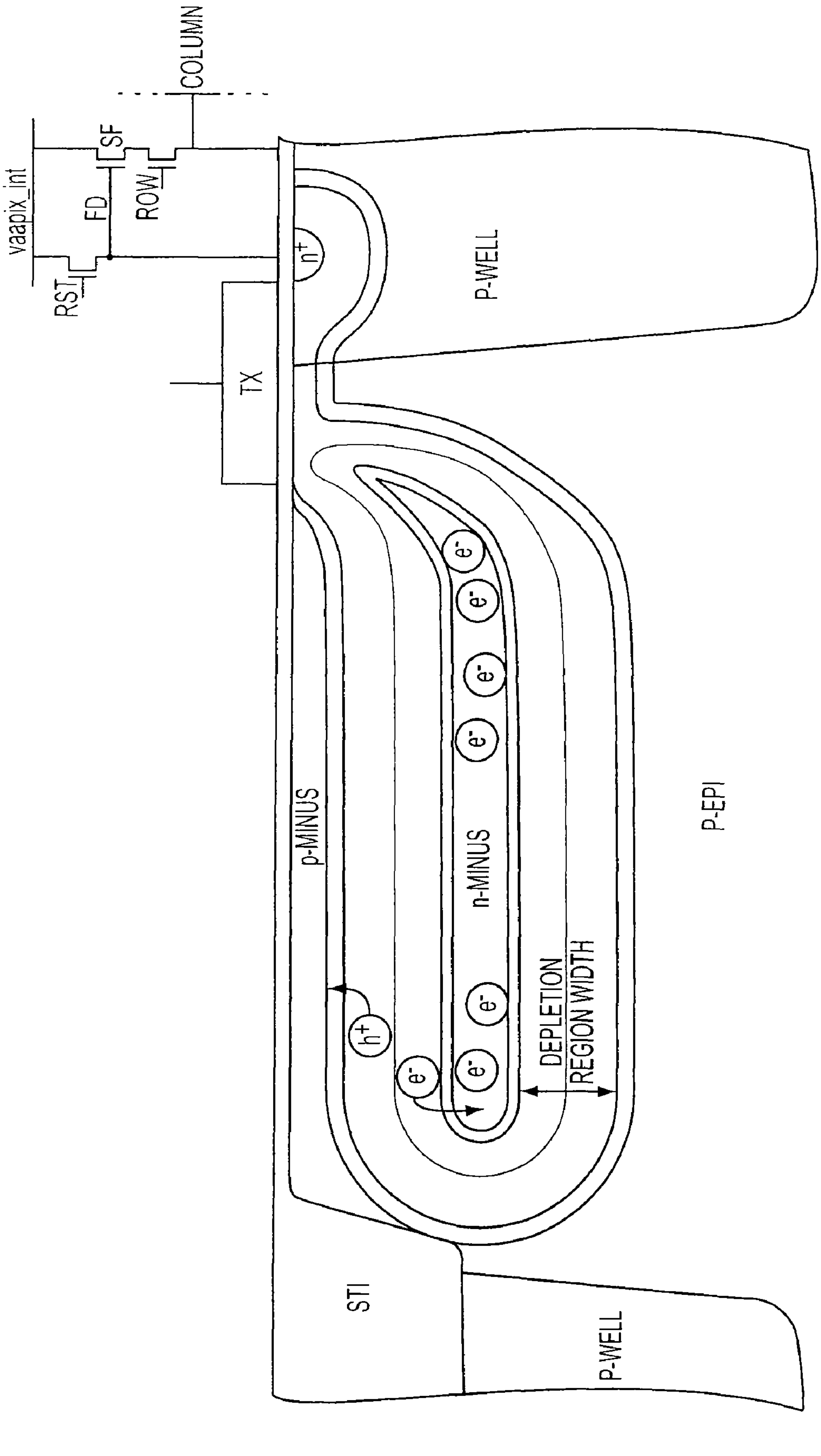
FIG. 1 is a diagram of a pixel array showing a cross-section of a substrate.

Referring first to FIG. 1, a single pixel is shown disposed on a silicon substrate. A reset transistor (RST) is coupled between the pixel power supply node vaapix_int and the floating diffusion node (FD). The n-minus region of the photodiode (PD) is sandwiched between the p-minus region and the p-epi region.

When conducting, the RST transistor couples vaapix_int to FD. As the FD voltage increases, the depletion region surrounding the n-minus layer of the PD expands and may contact the shallow trench isolation (STI). The STI which includes impurities and crystalline lattice defects, may inject undesired non-photo-generated carriers into the PD causing hot pixels and dark current. One solution to reduce this effect, is switching off or reducing the FD voltage.

The N-type diffusion areas within the pixel array are either directly or indirectly connected to vaapix_int and the P-epitaxial layer. One example of an N-type diffusion area that is indirectly connected to vaapix_int is the n-minus layer of the photodiode. This occurs during the anti-bloom mode, when the RST and TX transistors are turned on. One method to reduce this leakage charge is by isolating vaapix_int along with the n+ guard ring in a high impedance state. This method and others are described below.

Figure 2:
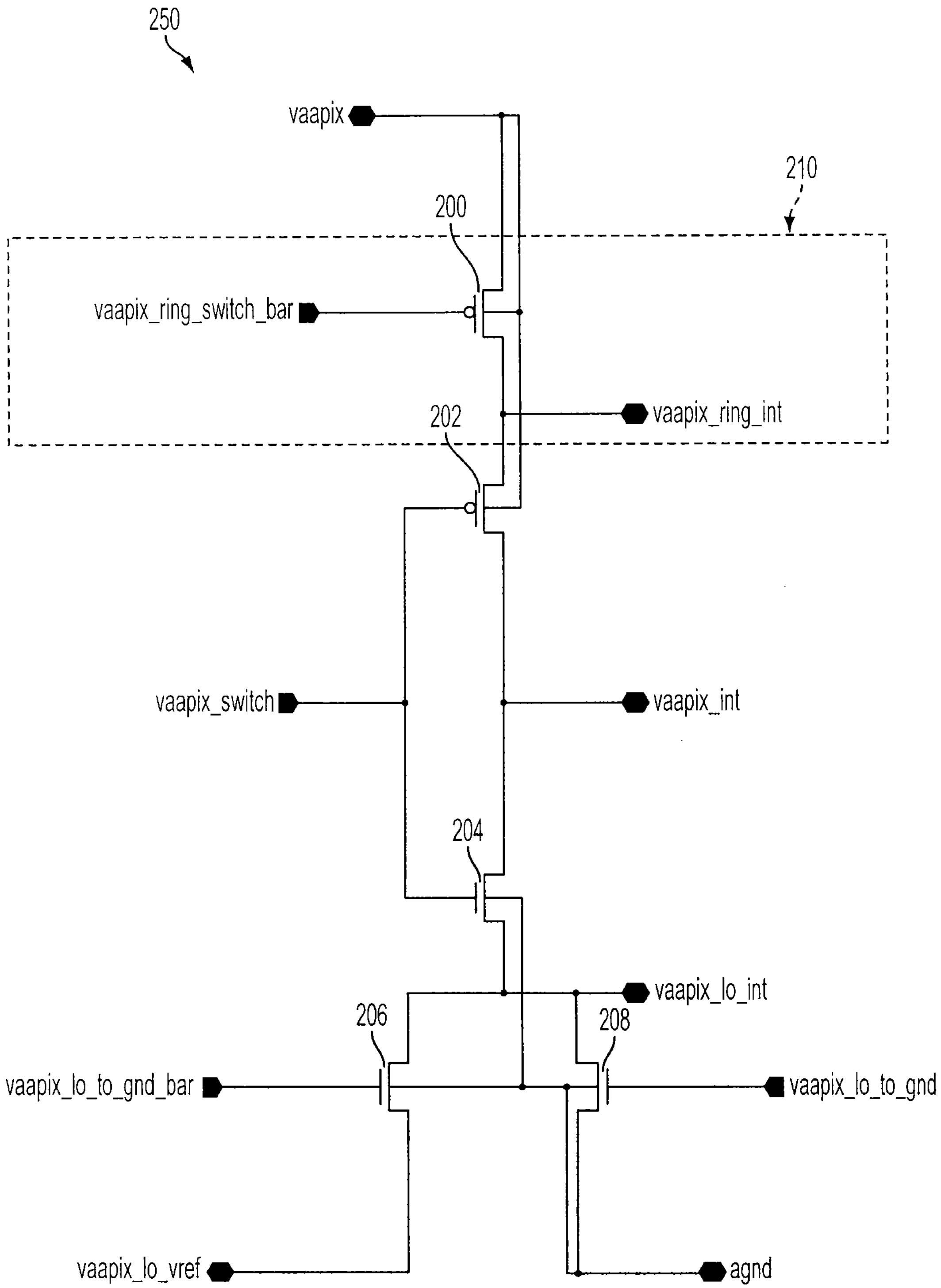
FIG. 2 is a schematic diagram of a pixel power switching module, in accordance with an embodiment of the present invention.

FIG. 2 shows an example of a pixel power switching circuit designated as 250. Switching circuit 250 includes PMOS transistor 202 and NMOS transistors 204, 206 and 208. The vaapix node is coupled to an external power supply. The vaapix_int node provides power to the pixels in the imager. A vaapix_lo_int node is coupled to either a low potential vaapix_lo_vref, or a ground potential AGND. Optional block 210 includes PMOS transistor 200 which provides an output from its vaapix_ring_int node to the n+ guard ring of each pixel in the imager.

Transistors 200-208 are controlled by various signals. The vaapix_switch signal controls the inverter structure of transistors 202 and 204 to couple vaapix_int to the external vaapix power supply, thereby providing a pull-up network (PUN). The vaapix_switch signal may also control switch module 250 to couple vaapix_int to the vaapix_lo_vref or AGND node, thereby providing a pull-down network (PDN).

The vaapix_int node may be pulled down by the PDN. During pull-down, transistor 204 couples vaapix_int to vaapix_lo_int. The voltage potential of the PDN is controlled by vaapix_lo_to_ground_bar and its complement vaapix_lo_to_gnd. These two signals enable transistors 206 and 208 to perform as a multiplexer. Specifically, transistors 206 and 208 couple vaapix_lo_vref or AGND to vaapix_lo_int. At the same time, transistor 202 de-couples vaapix_int from vaapix ensuring that the PUN is disabled during the PDN operation.

The vaapix_int node may also be pulled up to vaapix by the PUN. During pull-up, transistors 200 and 202 couple vaapix_int to vaapix. At the same time, transistor 204 de-couples vaapix_int from vaapix_lo_int ensuring that the PDN is disabled during the PUN operation.

In one embodiment, an optional high impedance mode is also provided by switching module 250. Specifically, transistor 200 and node vaapix_ring_int are included as optional high impedance circuit 210. In circuit 210, vaapix_ring_int is coupled to the n+ guard ring of the pixel and transistor 200 couples vaapix_ring_int to vaapix. When vaapix_switch is in a low state and vaapix_ring_switch_bar is in a high state, transistor 200 is turned off and transistor 202 is turned on. Thus, both vaapix_ring_int and vaapix_int are isolated from vaapix (PUN) and vaapix_lo_int (PDN).

Figure 3:
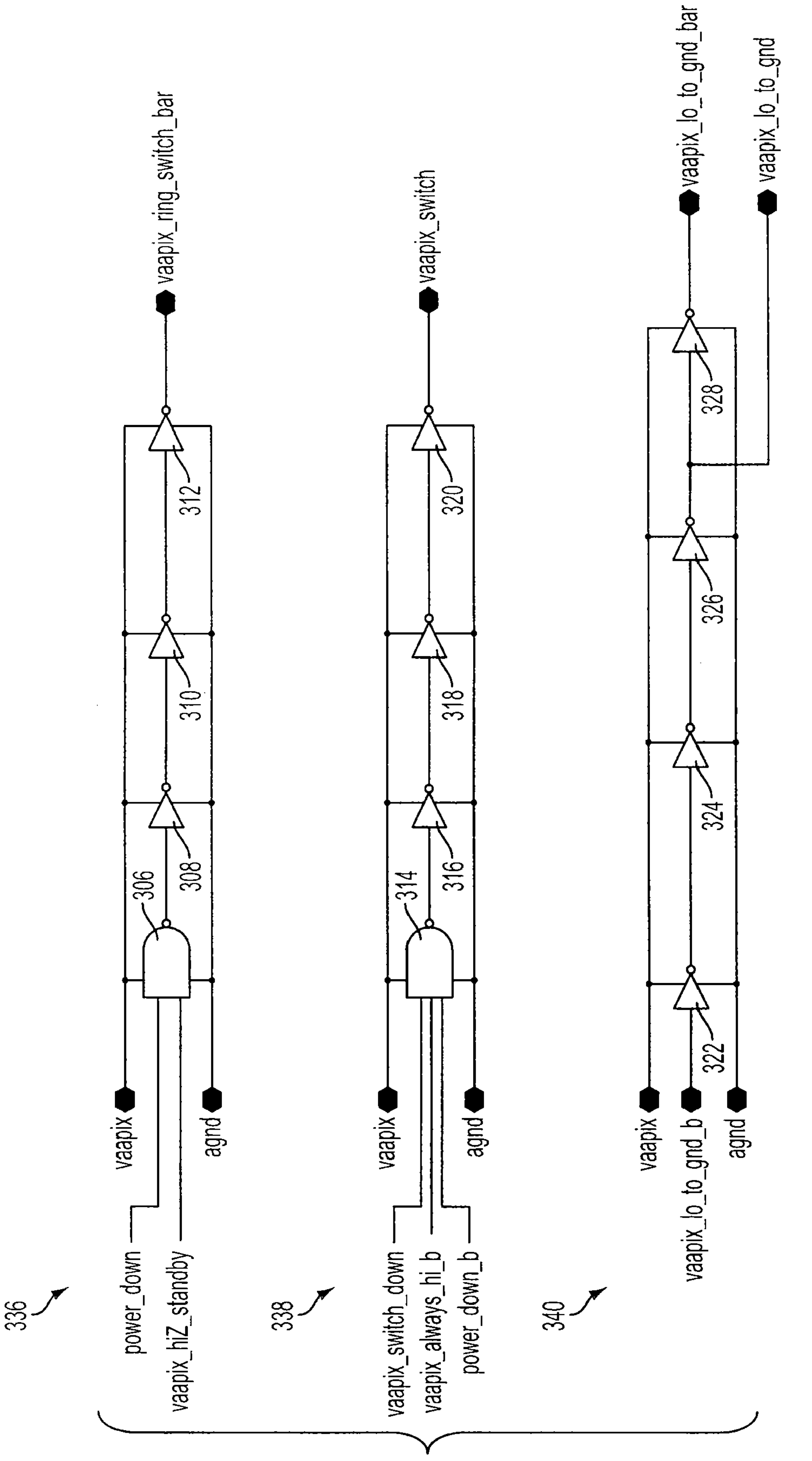
FIG. 3 is a schematic diagram of drivers used to control the pixel power switching module shown in FIG. 2, in accordance with an embodiment of the present invention.

In one embodiment, the signals that control the column module shown in FIG. 2, are generated by the logic circuits in FIG. 3. Logic circuits 336-340 of FIG. 3 produce the signals vaapix_ring_switch_bar, vaapix_switch and vaapix_lo_to_gnd/vaapix_lo_to_gnd_bar. These signals control transistors 200, 202/204 and 206/208 in switching module 250. The input/output behavior of logic circuits 336-340 are further shown in the logic table of FIG. 4.

In the PUN operation, vaapix_switch and vaapix_ring_switch_bar are generated by circuits 336 and 338 in FIG. 3. The behavior of circuits 336 and 338 with respect to the PUN operation are described in rows 1, 3 and 5 of FIG. 4. Specifically, there are three scenarios where vaapix_int is coupled to the PUN. In the first row of the table, power_down, vaapix_always_hi and vaapix_switch_down are all in a low state, thereby producing a low state vaapix_switch and vaapix_ring_switch_bar. Since vaapix_switch is in a low state, transistor 202 is turned on and transistor 204 is turned off. Also, since vaapix_ring_switch_bar is in a low state, transistor 200 is turned on. Similarly, this behavior occurs in two other scenarios (rows 3 and 5 of the table in FIG. 4). With either of the three scenarios described in rows 1, 3 and 5, vaapix_int is coupled to vaapix, thereby powering up the pixel.

In the PDN operation, vaapix_switch and vaapix_lo_to_gnd are generated by circuits 336 and 340 in FIG. 3. The behavior of circuits 336 and 340 with respect to the PDN operation are also described in FIG. 4. Specifically, if power_down is in a low state, vaapix_always_hi is in a low state and vaapix_switch_down is in a high state, then transistor 202 is turned off and transistor 204 couples vaapix_int to vaapix_lo_int.

Furthermore, the voltage potential of the PDN operation is selected by vaapix_lo_to_gnd. In one example, if vaapix_lo_to_gnd is in a high state, then vaapix_int is coupled to ground potential AGND. In another example, if vaapix_lo_to_gnd is in a low state, then vaapix_int is coupled to low reference potential vaapix_lo_vref. In general, transistors 206 and 208 are controlled as a multiplexer for the dual PDN operation which couples vaapix_int to either a low reference potential or a ground potential.

In the high impedance mode of switch 250, vaapix_switch and vaapix_ring_int are generated by circuits 336 and 338 in FIG. 3. The behavior of circuits 336 and 338 with respect to the high impedance mode are also described in FIG. 4. In the high impedance mode, both nodes vaapix_ring_int and vaapix_int are shorted together and isolated from the PUN and PDN. As shown in row 4 of FIG. 4, power_down is set to a high state and vaapix_hiz_standby_b is set to a low state, thereby producing a high vaapix_ring_switch_bar signal and a low vaapix_switch signal. Since vaapix_switch is in a low state, then transistor 202 shorts vaapix_ring_int with vaapix_int. Furthermore, since vaapix_ring_switch_bar is in a high state, then transistor 200 isolates the shorted nodes from both vaapix (PUN) and vaapix_lo_int (PDN).

Figure 5:
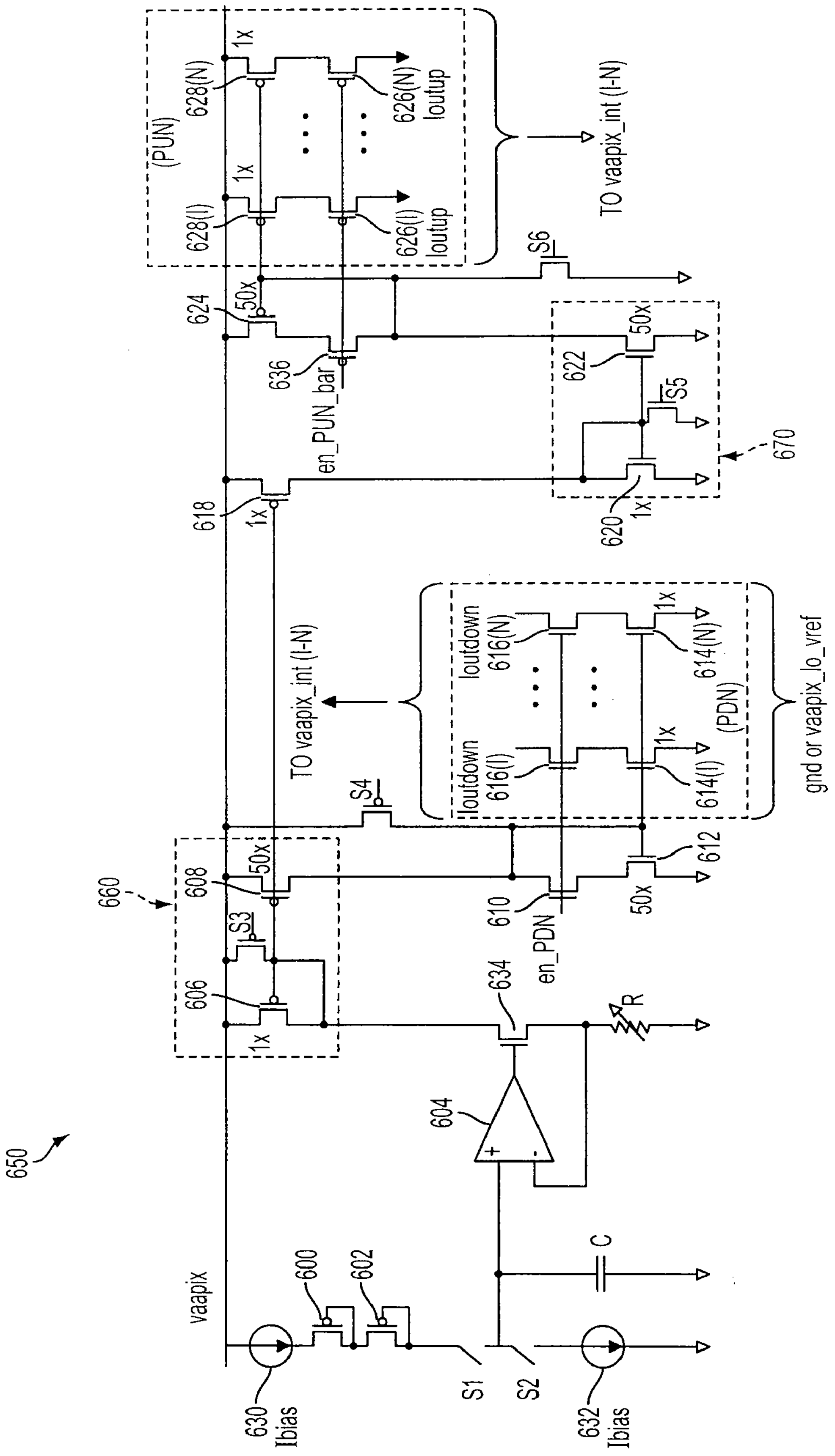
FIG. 5 is a schematic diagram of another pixel power switching module, in accordance with an embodiment of the present invention.

In another embodiment, controlling the power applied to the pixels is performed by switching circuit 650 as shown in FIG. 5. Switching circuit 650 has both an analog and a digital architecture. An advantage to having analog features in the switching module, is a constant charging/discharging current which may provide better uniformity of distributed settling. Another advantage is ramp charging/discharging with a programmable slope which may provide a softer transition during switching and less coupling artifacts.

The analog/digital switching module as shown in FIG. 5 may be configured in three operating modes (1) analog mode with rising/falling current ramps; (2) analog mode without rising/falling current ramps; and (3) digital mode with back-compatibility.

In this embodiment, switch 650 comprises current sources 630 and 632, PMOS level shifters 600 and 602, switches S1 and S2, capacitor C, op-amp 604, NMOS transistor 634 and variable resistor R. Switch 650 further comprises a current mirror 660 which includes transistors 606 and 608 that are controlled between analog and digital mode by transistor S3, and a current mirror 670 which includes transistors 620 and 622 that are controlled between analog and digital mode by transistor S5.

Switch 650 has a PDN comprising an enable transistor 610 for enabling transistors 616(1)-616(N). Specifically, transistors 616(1)-616(N) are coupled to the vaapix_int node for each pixel column in the imager. The PDN further comprises transistor 612 which is the input leg to a PDN current mirror, and transistors 614(1)-614(N) which are the output legs of the PDN current mirror. Transistors 614(1)-614(N) are coupled to ground potential AGND or a low potential vaapix_lo_vref. In general, the ratio between the sizing of transistors 612 and 614(1)-614(N) may be substantially larger than 1 to ensure fast settling of their shared gate terminal which is a global net across the column module horizontally.

Switch circuit 650 in FIG. 5 also has a PUN comprising enable transistor 636 for enabling transistor 626(1)-626(N). Transistors 626(1)-626(N) are coupled to vaapix_int for each column in the imager. The PUN further comprises transistor 624 which is the input leg to a current mirror, and transistors 628(1)-628(N) which are the output legs of the current mirror. Transistors 628(1)-628(N) are coupled to vaapix.

In analog mode, the switching circuit is able to perform both the PUN and PDN operations with or without rising and falling ramp currents. In the analog mode, digital switches S3, S4, S5 and S6 are turned off. Thus, current mirrors 660, 670, PUN and PDN to operate normally.

Figure 7:
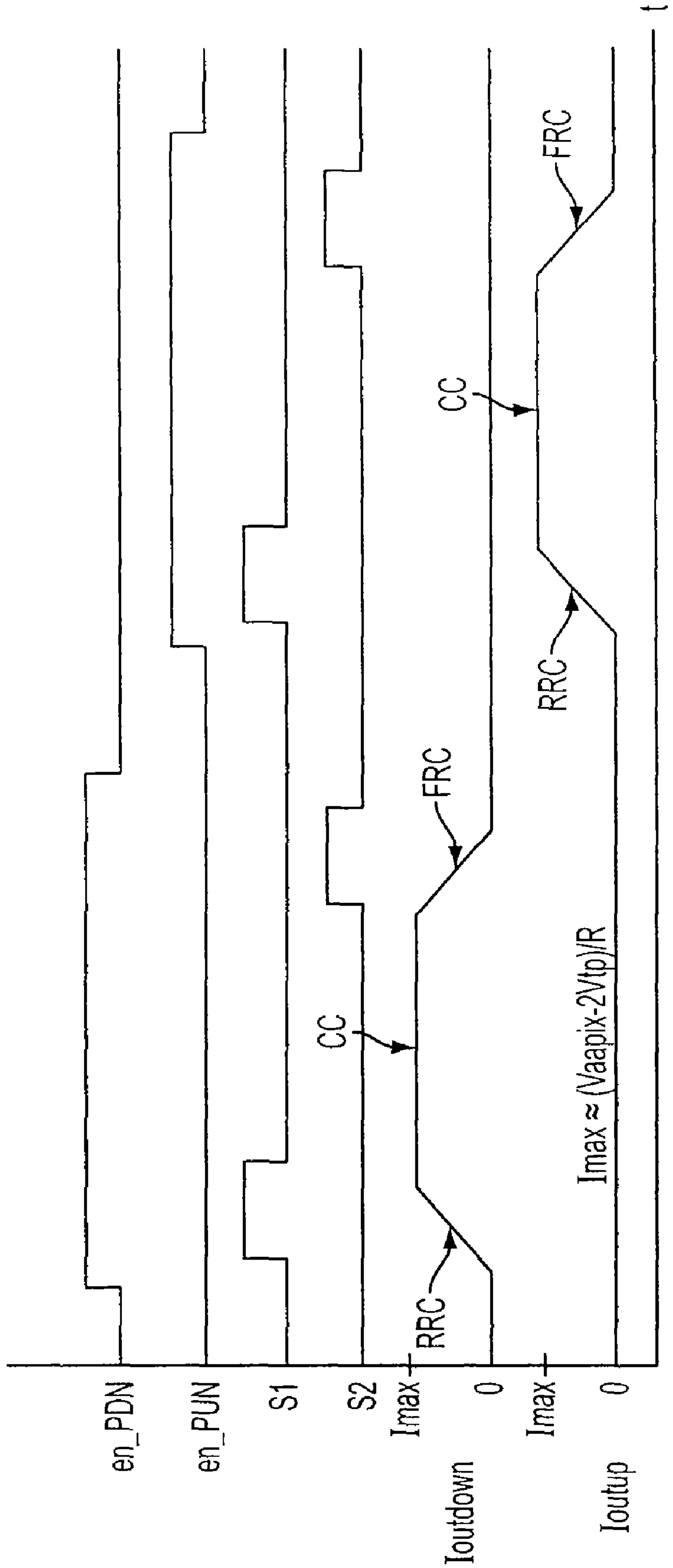
FIG. 7 is a timing diagram for the behavior of the pixel power switching module of FIG. 5, in accordance with an embodiment of the present invention.

In the PDN operation shown in the timing diagram of FIG. 7, enable signal en_PDN is in a high state which enables transistor 610. In contrast, the PUN enable signal en_PUN is in a low state, thereby disabling transistor 636 and the PUN. As shown in FIG. 7, when en_PDN is high, switch S1 closes and switch S2 opens. The bias current of source 630 flows through level shifters 600/602 where vaapix is shifted by 2 Vtp. Vtp is the gate to source voltage for each of the level shifters 600 and 602. After flowing through the level shifters, Ibias then flows through S1 into the non-inverting input node of op-amp 604 (also the positive terminal of capacitor C). The negative feedback formed by op-amp 604 and transistor 634 allow the inverting input node of the op-amp 604 (also the upper node of the resistor R) to follow the non-inverting input node. Therefore, a rising ramp voltage is applied to the resistor R which generates the rising ramp current shown in FIG. 7. The rising ramp current is then mirrored from transistor 606 to 608, thereby enabling current from vaapix to flow through the input leg of current mirror transistor 612. Transistor 612 mirrors the current to PDN transistors 614(1)-614(N), which produces pull-down current Ioutdown in FIG. 7.

The timing diagram of FIG. 7 further illustrates that when switch S1 closes, current Ioutdown in the PDN operation is a rising ramp current (RRC). After Ioutdown reaches its maximum current Imax, S1 opens so that Ioutdown maintains at a constant current (CC). When switch S2 closes, a falling ramp current (FRC) is produced by drawing Ibias current 632 from op-amp 604 and capacitor C. By sourcing and sinking Ibias, RRC and FRC as shown in the timing diagram of FIG. 7 may be achieved.

In general, the PUN operation works similarly to the above described PDN operation. Thus, during the PUN operation, transistor 606 mirrors the current flowing through resistor R to transistors 618 and 620. Then, transistor 620 mirrors the current to transistors 622, 636 and 624. The current flowing through transistor 624 is then mirrored to the PUN current mirror output leg transistors 628(1)-628(N). Therefore, the pull-up current Ioutup in the timing diagram of FIG. 7, has an RRC when switch S1 is closed, a CC when neither of the switches is closed and a FRC when switch S2 is closed.

In general, the PDN and PUN are complimentary networks so that only one of them is operating at a given time. Thus, vaapix_int is either coupled to vaapix during the PUN operation or AGND/vaapix_lo_vref during the PDN operation.

If rising and falling ramps are not desired during the PDN and PUN operation, the upper plate of capacitor C may be shorted to vaapix or some other adjustable reference voltage. This configuration maintains a constant voltage on the input terminal of op-amp 604 therefore disabling the rising and falling ramps.

If a digital mode of operation is desired, switches S3, S4, S5 and S6 are turned on so that the PUN and PDN are driven by power rails (i.e., AGND and vaapix). Specifically, the PDN current mirror is driven by vaapix via switch S4, while the PUN current mirror is driven by AGND via switch S6. Also, in the digital mode, the analog circuitry comprising Ibias sources 630 and 632, transistors 600 and 602, switches S1 and S2, capacitor C, resistor R, op-amp 604, and transistors 606 and 634 are all disabled.

Thus, during PDN operation, PDN enable transistor 610 is turned on and PUN enable transistor 636 is turned off allowing Ioutdown to flow from power nodes vaapix_int(1-N) of each column through transistors 614(1)-614(N). Similarly, during the PUN operation, PUN transistor 636 is turned on while the PDN transistor 610 is turned off, allowing vaapix to flow to vaapix_int(1-N) through transistors 626(1)-626(N).

Figure 6:
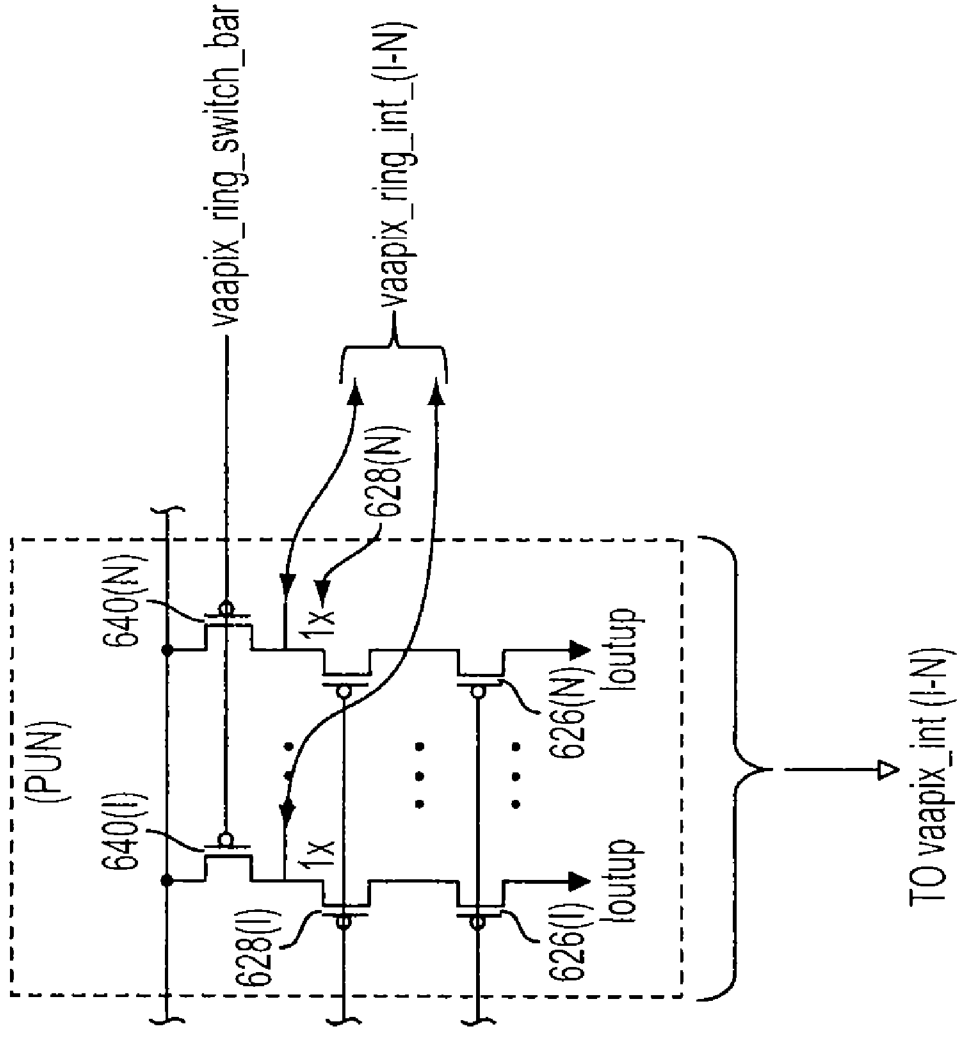
FIG. 6 is a schematic diagram of the pixel power switching module of FIG. 5 with optional ring transistors, in accordance with an embodiment of the present invention.

As described previously with reference to FIG. 2, an optional high impedance mode was provided by an optional ring transistor 200. Similarly, another embodiment of switching module 650 is illustrated in FIG. 6 where optional ring transistors 640(1)-640(N) provide a high impedance mode. The ring transistors create a buffer that decouple the PUN current mirror from vaapix. The n+ guard ring of the silicon substrate for each pixel in the imager is coupled to nodes vaapix_ring_int_(1-N) between transistors 640(1)-640(N) and 682(1)-628(N).

When high impedance mode is desired, enable transistors 626(1)-626(N) as well as ring transistors 640(1)-640(N) in FIG. 6 are turned off to isolate vaapix_ring_int(1-N) from vaapix. Then, en_PUN_bar (complement of en_PUN) is set low to couple vaapix_int(1-N) with vaapix_ring_int(1-N). Therefore vaapix_int(1-N) and vaapix_ring_int(1-N) are shorted together while being isolated from both vaapix (PUN) and AGND/vaapix_lo_vref (PDN).

Both embodiments of the switching modules in FIG. 2 and FIG. 5 control the power supplied to power node vaapix_int. These switching modules may be utilized in both a global reset mode and an electronic rolling shutter mode in an imager. In a global reset mode, the whole pixel array is integrating simultaneously. Thus, vaapix_int for each column can be globally pulled down to a low state during integration without interruption. In electronic rolling shutter mode, however, each row is integrated sequentially. When integration time is not more than one row time, vaapix_int for each column can be globally maintained in the low state. If the integration time is more than one row time, however, vaapix_int may have to be globally pulled up to a high state during a portion of integration.

Although this invention is illustrated and described herein with reference to specific embodiments, the invention is not intended to be limited to the details shown. Rather, various modifications may be made in the details within the scope and range of the equivalents of the claims and without departing from the invention.

What is claimed:

1. A controller for applying an external voltage potential to a power node of a pixel in an imager array comprising:

first and second switches, respectively, coupling the external voltage potential and a ground potential to the power node of the pixel, wherein the first and second switches are logically complementary to each other, the first switch couples the external voltage potential to the power node of the pixel during reset and readout periods of the pixel, and the second switch couples the ground potential to the power node of the pixel during an integration period of the pixel.

2. The controller of claim 1 including a ring switch coupling the external voltage potential to an n+ guard ring of the pixel, and the ring switch coupling the external voltage potential to the first switch, wherein the ring switch isolates the n+ guard ring from the external voltage potential.

3. The controller of claim 1 including, a ground switch coupled between the ground potential and the second switch, wherein the ground switch and the second switch couple the ground potential to the pixel power node.

4. The controller of claim 3 including, a low reference switch coupled between a low reference potential and the second switch, wherein the low reference switch and the second switch couple the low reference potential to the pixel power node.

5. A system for controlling power to a column of pixels in an imager, wherein each pixel includes a reset transistor and a source follower transistor, the system comprising:

a pull-up current mirror coupled to both reset and source follower transistors of each pixel on the column, and a pull-down current mirror coupled to the same reset and source follower transistors of each pixel on the column, wherein the pull-up and pull-down current mirrors, respectively, couple an external voltage potential and a ground potential to both reset and source follower transistors of each pixel on the column.

6. The system of claim 5 including a first switch coupled to the pull-up current mirror; and a second switch coupled to the pull-down current mirror;

wherein the first and second switches are controlled, in a complementary manner to each other, and enable the pull-up and pull-down current mirrors, respectively, to couple either the external voltage potential or the ground potential to both reset and source follower transistors of each pixel on the column.

7. The system of claim 5 including a first switch coupled to the pull-up current mirror, and a second switch coupled to the pull-down current mirror, wherein the first and second switches are controlled to saturate the amount of current flowing through the pull-up and pull-down current mirrors, respectively.

8. The system of claim 7 including a ramp generator coupled to the pull-up and pull-down current mirrors, wherein the ramp generator controls an amount by which each of the pull-up and pull-down current mirrors conduct.

9. The system of claim 8 wherein the ramp generator includes an amplifier, a capacitor coupled to an input terminal of the amplifier, a current source applying current to the input terminal of the amplifier and charging the capacitor by way of third switch, and a current sink sinking current from the input terminal of the amplifier by way of a fourth switch;

wherein the current source produces a rising ramp current on an output terminal of the amplifier, and the current sink produces a falling ramp current on the output terminal of the amplifier.

10. The system of claim 5 wherein the ground potential is coupled to the reset and source follower transistors during an integration period of each pixel.

11. The system of claim 5 wherein the external voltage potential is coupled to the reset and source follower transistors during reset and readout periods of each pixel.

12. The system of claim 5 wherein a plurality of pull-up and pull-down current mirrors are coupled to each column of the imager.

13. A system for applying power to pixels in an imager comprising:

each pixel including a pixel power node coupled between first and second switches, and a third switch coupled between an operating potential and the first switch, the first switch for applying the operating potential to the pixel power node, the second switch for applying a ground potential to the same pixel power node, and the third switch for applying the operating potential to the first switch, wherein the second and third switches isolate the pixel power node from both the operating potential and the ground potential, when the pixels are in a standby period.

14. The system of claim 13 wherein an n+ guard ring is coupled between the first and third switches, the n+ guard ring isolated from the operating and ground potentials by the second and third switches.

15. The system of claim 14 wherein the third switch applies the operating potential to the n+ guard ring during reset and readout periods of the pixels.

16. The system of claim 15 wherein during the standby period the n+ guard ring and power node are isolated in a high impedance mode by:

the first switch coupling the n+ guard ring of the pixel to the pixel power node, the second switch decoupling the n+ guard ring and pixel power node from the ground potential, and the third switch decoupling the n+ guard ring and pixel power node from the operating potential.

* * * * *